United States Patent
Frank et al.

(10) Patent No.: US 9,398,720 B1
(45) Date of Patent: Jul. 19, 2016

(54) CHASSIS WITH AIRFLOW AND THERMAL MANAGEMENT

(71) Applicant: EMC Corporation, Hopkinton, MA (US)

(72) Inventors: Christopher Frank, San Jose, CA (US); Timothy Olesiewicz, Dublin, CA (US)

(73) Assignee: EMC Corporation, Hopkinton, MA (US)

( * ) Notice: Subject to any disclaimer, the term of this patent is extended or adjusted under 35 U.S.C. 154(b) by 77 days.

(21) Appl. No.: 14/530,617

(22) Filed: Oct. 31, 2014

Related U.S. Application Data

(60) Provisional application No. 62/005,787, filed on May 30, 2014.

(51) Int. Cl.
*H05K 7/20* (2006.01)
*H01L 23/473* (2006.01)

(52) U.S. Cl.
CPC ................................ *H05K 7/20136* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| D257,345 S | 10/1980 | Levy |
| D260,881 S | 9/1981 | McKinsey et al. |
| 4,648,066 A | 3/1987 | Pitt |
| 5,045,960 A | 9/1991 | Eding |
| 5,065,321 A | 11/1991 | Bezos et al. |

(Continued)

FOREIGN PATENT DOCUMENTS

| DE | 102006016743 A1 | 10/2007 |
| EP | 2275913 A1 | 1/2011 |

(Continued)

OTHER PUBLICATIONS

Press Release, "3M Introduces New CompactFlash brand Type II Card Ejectors for Long Guide CFII Headers," 3M News, www.3M.com, Jul. 6, 2006 (2 pages).

(Continued)

*Primary Examiner* — Anthony Haughton
*Assistant Examiner* — Razmeen Gufur
(74) *Attorney, Agent, or Firm* — Osha Liang LLP

(57) ABSTRACT

A system includes a chassis having a longitudinal axis defined therethrough and an upper airflow chamber, a central airflow chamber, and a lower airflow chamber formed longitudinally therethrough, a midplane secured within the chassis in a direction perpendicular to the longitudinal axis defined through the chassis, in which the midplane defines a front portion and a rear portion within the chassis, and wherein the midplane is configured to allow airflow therethrough, and a first printed circuit board disposed within the rear portion of the chassis in the upper airflow chamber, the first printed circuit board having a first end, a second end, and an opening formed therethrough, in which the first end of the first printed circuit board is operatively coupled to the midplane.

20 Claims, 5 Drawing Sheets

(56) References Cited

U.S. PATENT DOCUMENTS

| | | | |
|---|---|---|---|
| D332,256 S | 1/1993 | Lewis | |
| 5,214,550 A | 5/1993 | Chan | |
| 5,253,129 A | 10/1993 | Blackborow et al. | |
| 5,297,067 A | 3/1994 | Blackborow et al. | |
| 5,316,488 A | 5/1994 | Gardner et al. | |
| 5,387,115 A | 2/1995 | Kozel et al. | |
| 5,691,860 A | 11/1997 | Hoppe | |
| 5,701,894 A | 12/1997 | Cherry et al. | |
| 5,764,480 A | 6/1998 | Crump et al. | |
| 5,825,616 A | 10/1998 | Howell et al. | |
| D408,379 S | 4/1999 | McGraw et al. | |
| 6,083,018 A | 7/2000 | Hara et al. | |
| 6,137,759 A | 10/2000 | Ogiro et al. | |
| 6,174,180 B1 | 1/2001 | Chen | |
| 6,185,103 B1 | 2/2001 | Yamada | |
| 6,222,727 B1 | 4/2001 | Wu | |
| 6,359,778 B1 | 3/2002 | Wu | |
| 6,373,696 B1 | 4/2002 | Bolognia et al. | |
| 6,388,884 B1 | 5/2002 | Greco et al. | |
| 6,396,704 B1 | 5/2002 | White | |
| 6,683,785 B1 | 1/2004 | Chen | |
| 6,987,927 B1 | 1/2006 | Battaglia et al. | |
| 7,023,704 B1 | 4/2006 | Zarnowitz et al. | |
| 7,088,579 B1 | 8/2006 | Konshak | |
| 7,251,145 B1 | 7/2007 | Reznikov | |
| 7,362,566 B1 | 4/2008 | Sivertsen | |
| 7,396,244 B1 | 7/2008 | Barna et al. | |
| 7,944,691 B1 | 5/2011 | Pounds | |
| D698,792 S | 2/2014 | Lin et al. | |
| 8,737,067 B1* | 5/2014 | Kim | H05K 7/1492 342/175 |
| 2002/0018423 A1 | 2/2002 | Goble | |
| 2002/0030927 A1 | 3/2002 | Kimura et al. | |
| 2002/0033890 A1 | 3/2002 | Nicklos et al. | |
| 2002/0114254 A1 | 8/2002 | Ohgaki | |
| 2002/0122295 A1 | 9/2002 | Laing | |
| 2002/0169912 A1 | 11/2002 | Mills et al. | |
| 2002/0182896 A1 | 12/2002 | Welsh et al. | |
| 2003/0041203 A1 | 2/2003 | Jones et al. | |
| 2003/0136849 A1 | 7/2003 | Adelmann | |
| 2003/0161199 A1 | 8/2003 | Estakhri | |
| 2004/0057702 A1 | 3/2004 | Battaglia et al. | |
| 2004/0213141 A1 | 10/2004 | Lin | |
| 2004/0228184 A1 | 11/2004 | Mathiowetz | |
| 2004/0233629 A1 | 11/2004 | Wang et al. | |
| 2004/0242041 A1 | 12/2004 | Ngo | |
| 2005/0018397 A1 | 1/2005 | Kay et al. | |
| 2005/0259395 A1* | 11/2005 | Espinoza-lbarra | H05K 7/20836 361/695 |
| 2006/0030080 A1 | 2/2006 | Hsueh et al. | |
| 2006/0061955 A1 | 3/2006 | Imblum | |
| 2006/0072239 A1 | 4/2006 | Iftikar | |
| 2006/0146441 A1 | 7/2006 | Chih | |
| 2007/0070669 A1 | 3/2007 | Tsern | |
| 2007/0217171 A1 | 9/2007 | Le | |
| 2007/0274039 A1* | 11/2007 | Hamlin | H05K 7/2019 361/695 |
| 2007/0293137 A1* | 12/2007 | Crippen | G06F 1/20 454/184 |
| 2008/0002348 A1 | 1/2008 | Kim et al. | |
| 2008/0094799 A1* | 4/2008 | Zieman | G06F 1/20 361/695 |
| 2008/0112125 A1 | 5/2008 | Martin et al. | |
| 2008/0218949 A1* | 9/2008 | Hughes | H05K 7/20718 361/678 |
| 2008/0218957 A1 | 9/2008 | Kim | |
| 2008/0225479 A1* | 9/2008 | Zieman | G06F 1/20 361/694 |
| 2008/0266779 A1 | 10/2008 | Thomas et al. | |
| 2008/0298009 A1 | 12/2008 | Weng et al. | |
| 2008/0298014 A1 | 12/2008 | Franco | |
| 2008/0310107 A1* | 12/2008 | Vinson | H05K 7/20736 361/695 |
| 2008/0316704 A1* | 12/2008 | Vinson | G06F 1/20 361/695 |
| 2009/0016019 A1* | 1/2009 | Bandholz | H05K 7/20736 361/695 |
| 2009/0034349 A1 | 2/2009 | Miura | |
| 2009/0086456 A1 | 4/2009 | Milo et al. | |
| 2009/0100217 A1 | 4/2009 | Battaglia et al. | |
| 2009/0109619 A1* | 4/2009 | Wise | H05K 7/20836 361/695 |
| 2009/0135558 A1* | 5/2009 | Hughes | H05K 7/20727 361/679.46 |
| 2009/0147462 A1 | 6/2009 | Zhu et al. | |
| 2009/0154098 A1* | 6/2009 | Nguyen | H05K 7/1445 361/695 |
| 2009/0172279 A1 | 7/2009 | Yuan et al. | |
| 2009/0185355 A1 | 7/2009 | Zhu et al. | |
| 2009/0198927 A1 | 8/2009 | Bondurant et al. | |
| 2009/0210636 A1 | 8/2009 | Karamcheti et al. | |
| 2009/0257191 A1* | 10/2009 | Ecker | H05K 7/20736 361/690 |
| 2009/0279243 A1 | 11/2009 | Amidi et al. | |
| 2010/0002382 A1* | 1/2010 | Aybay | H05K 7/20563 361/695 |
| 2010/0014248 A1* | 1/2010 | Boyden | H05K 7/20563 361/695 |
| 2010/0142243 A1 | 6/2010 | Baxter | |
| 2010/0323757 A1 | 12/2010 | Seflic et al. | |
| 2010/0328886 A1* | 12/2010 | Nguyen | H05K 7/1445 361/695 |
| 2010/0332711 A1 | 12/2010 | Li et al. | |
| 2011/0080701 A1* | 4/2011 | Bisson | H05K 7/20563 361/679.5 |
| 2011/0153903 A1 | 6/2011 | Hinkle et al. | |
| 2011/0222234 A1 | 9/2011 | Davis et al. | |
| 2011/0261521 A1 | 10/2011 | Lo | |
| 2011/0292588 A1 | 12/2011 | Seeley | |
| 2012/0010754 A1* | 1/2012 | Matteson | H05K 7/20836 700/282 |
| 2012/0050986 A1* | 3/2012 | Riebel | H05K 7/1488 361/679.48 |
| 2012/0120596 A1* | 5/2012 | Bechtolsheim | H05K 7/20572 361/679.48 |
| 2012/0233402 A1 | 9/2012 | Laaksonen et al. | |
| 2012/0278534 A1 | 11/2012 | Sun et al. | |
| 2012/0327597 A1* | 12/2012 | Liu | H05K 7/20736 361/692 |
| 2013/0054862 A1 | 2/2013 | Tsai | |
| 2013/0107424 A1 | 5/2013 | Thomas et al. | |
| 2013/0107443 A1 | 5/2013 | Kim et al. | |
| 2013/0148287 A1 | 6/2013 | Chang | |
| 2013/0163175 A1 | 6/2013 | Kim et al. | |
| 2013/0176676 A1 | 7/2013 | Keffeler et al. | |
| 2013/0176677 A1 | 7/2013 | Rust et al. | |
| 2013/0342989 A1 | 12/2013 | Singleton | |
| 2014/0078660 A1 | 3/2014 | Dondzik et al. | |
| 2014/0087787 A1 | 3/2014 | Rivera-Sanchez | |

FOREIGN PATENT DOCUMENTS

| | | |
|---|---|---|
| JP | 06-309860 A | 4/1994 |
| WO | 2005029936 A1 | 3/2005 |
| WO | 2007056669 A2 | 5/2007 |
| WO | 2008103359 A1 | 8/2008 |
| WO | 2013029264 | 3/2013 |

OTHER PUBLICATIONS

Doug Hoy, "Delphi Connection Systems Adds to Growing Portfolio with Introduction of PCI Express(TM), DDR2-DIMM Series; Computing Products' Availability Announced During Appearance at IDF.," PR Newswire, http://www.thefreelibrary.com/Delphi+Connection+Systems...s+to+Growing+Portfolio+with+Intruction...-a0121678034, Sep. 7, 2004 (4 pages).

StarTech.com, "Removable 2.5" SATA HDD Enclosure/Backup System/Mobile Rack for 3.5/5.25" Bay", Product ID: SAT2510U3REM, http://www.startech.com/HDD/Mobile-Racks/Removable-Hard-Drive-Enclosure-Backup-System~SAT2510U3REM, date accessed Apr. 16, 2014 (3 pages).

(56) References Cited

OTHER PUBLICATIONS

PC Support Services Ltd., "The Saturn Mobile Rack", http://www.pcssl.co.nz/documents/prodinfo/addonics/Saturn%20and%20Cipher/MobileRack.htm, dated accessed Apr. 16, 2014 (5 pages).

Icy Dock, "EZ-Fit MB99OSP-B Tool-less Dual 2.5" SSD/HDD Mounting Kit / Bracket", http://www.icydock.com/goods.php?id=79, date accessed Apr. 16, 2014 (3 pages).

"Removable Memory Cartridge Houses 2.5-Inch SATA Drives", http://www.cotsjournalonline.com/articles/view/103844, date accessed Apr. 16, 2014 (1 page).

Tapeonline.com, "Imation RDX 500GB Removable Cartridge", http://www.tapeonline.com/products/imation-rdx-rdx-500gb-removable-cartridge, date accessed Apr. 16, 2014 (2 pages).

"Quantum RDX", Quantum Datasheet, http://www.quantum.com/products/removablediskdrives/rdx/index.aspx, date accessed Apr. 16, 2014 (2 pages).

Plastiras, Elias, "HP Z1 workstation (B4F79PA) review", PC World, http://www.pcworld.idg.com.au/review/hp/z1_workstation_b4f79pa_review/426935/, Jul. 6, 2012 (12 pages).

"CWC Debuts Low-Cost Rugged, Removable Solid State Memory Module Carrier", http://www.unmannedsystemstechnology.com/2013/12/cwc-debuts-low-cost-rugged-removable-solid-state-memory-module-carrier/, dated Dec. 19, 2013 (2 pages).

Curtiss-Wright, "Curtiss-Wright Acquired Parvus Corporation, Extends Curtiss-Wright's Capabilities in Rugged Small Form Factor Computing and Communications Subsystems", http://www.parvus.com/product/overview.aspx?prod=RuggedRemovableMassStorage, date accessed Apr. 15, 2014 (2 pages).

Curtiss-Wright, Press Release, "Curtiss-Wright Controls Introduces Rugged Cartridges for Standard High-Density SATA Solid State Drives", http://news.thomasnet.com/fullstory/Rugged-Cartridges-facilitate-removeable-SATA-SSD-deployment-20019299, dated Dec. 12, 2013 (7 pages).

Synchrotech, "PCMCIA ATA Flash PC Cards FMJ Industrial", http://www.synchrotech.com/products/ata-flash-pcmcia-memory-pc_cards_12-fmj-industrial.html, date accessed Apr. 15, 2014 (2 pages).

Molex, "CompactFlash™", http://www.molex.com/molex/products/family?channel=products&chanName=family&key=compactflash, date accessed Apr. 15, 2014 (5 pages).

* cited by examiner

CHASSIS WITH AIRFLOW AND THERMAL MANAGEMENT

CROSS-REFERENCE TO RELATED APPLICATIONS

Pursuant to 35 U.S.C. §119(e), this application claims benefit of U.S. Provisional Application No. 62/005,787 filed on May 30, 2014, entitled "STORAGE ASSEMBLY SYSTEM." The disclosure of the U.S. Provisional Application is incorporated herein by reference in its entirety.

BACKGROUND

Storage assembly systems may include a chassis to house various components of the system. In particular, a storage assembly system may include components such a fan module and a printed circuit board. A fan module may be used to pull or push air through the chassis of a storage assembly system to provide cooling to one or more components disposed within the chassis of the storage assembly system.

DETAILED DESCRIPTION

In one aspect, embodiments disclosed herein relate generally to thermal management of a storage assembly system. More specifically, one or more embodiments disclosed herein relate to systems and methods to manage airflow within a storage assembly to controllably manage thermal conditions within a storage assembly.

Although one or more of these embodiments may be preferred, the embodiments disclosed should not be interpreted, or otherwise used, as limiting the scope of the disclosure, including the claims. In addition, those skilled in the art will appreciate that the following description has broad application, and the discussion of any embodiment is meant only to be exemplary of that embodiment, and not intended to suggest that the scope of the disclosure, including the claims, is limited to that embodiment.

Certain terms are used throughout the following description and claims to refer to particular features or components. As those skilled in the art will appreciate, different persons may refer to the same feature or component by different names. This document does not intend to distinguish between components or features that differ in name but not function. The figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first component is coupled to a second component, that connection may be through a direct connection, or through an indirect connection via other components, devices, and connections.

Figure 1A:
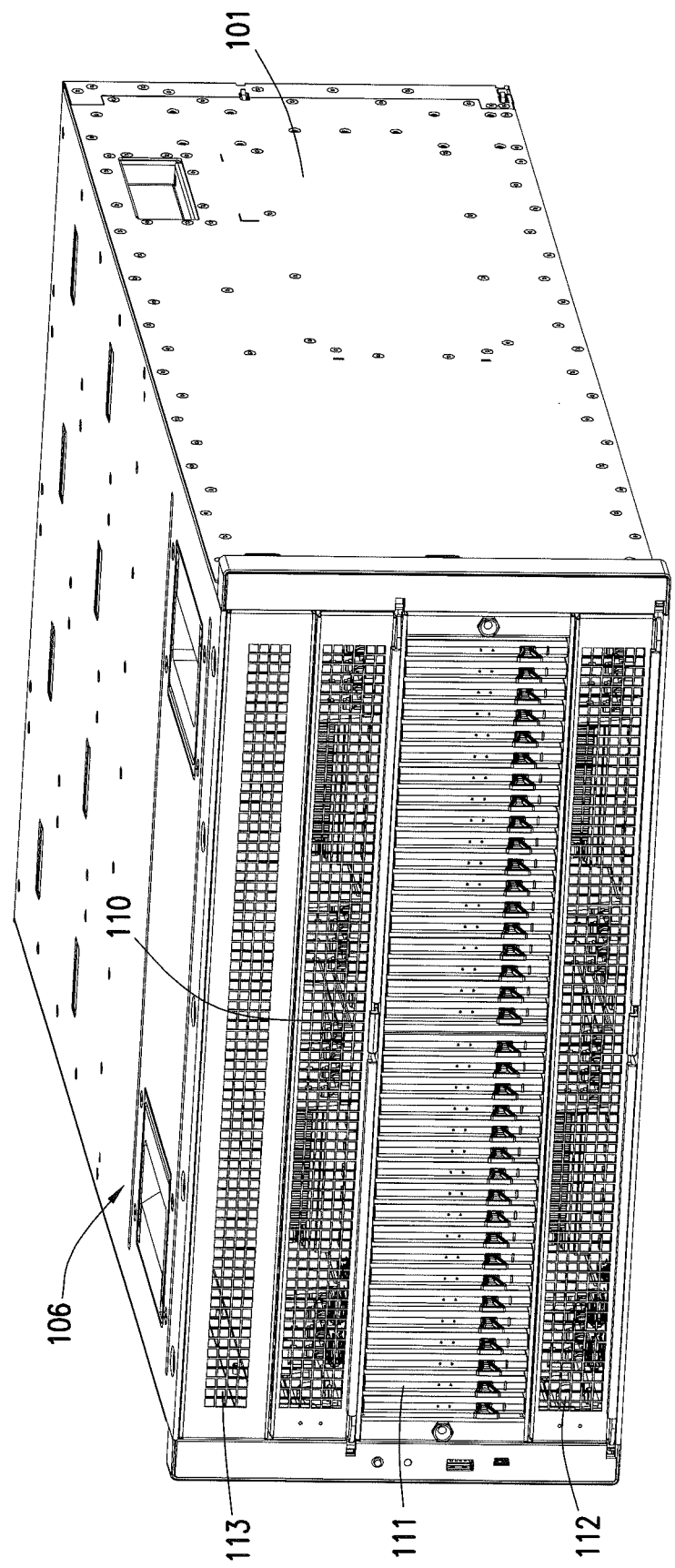
FIG. 1A shows a perspective view of a storage assembly in accordance with embodiments of the invention.
Figure 1B:
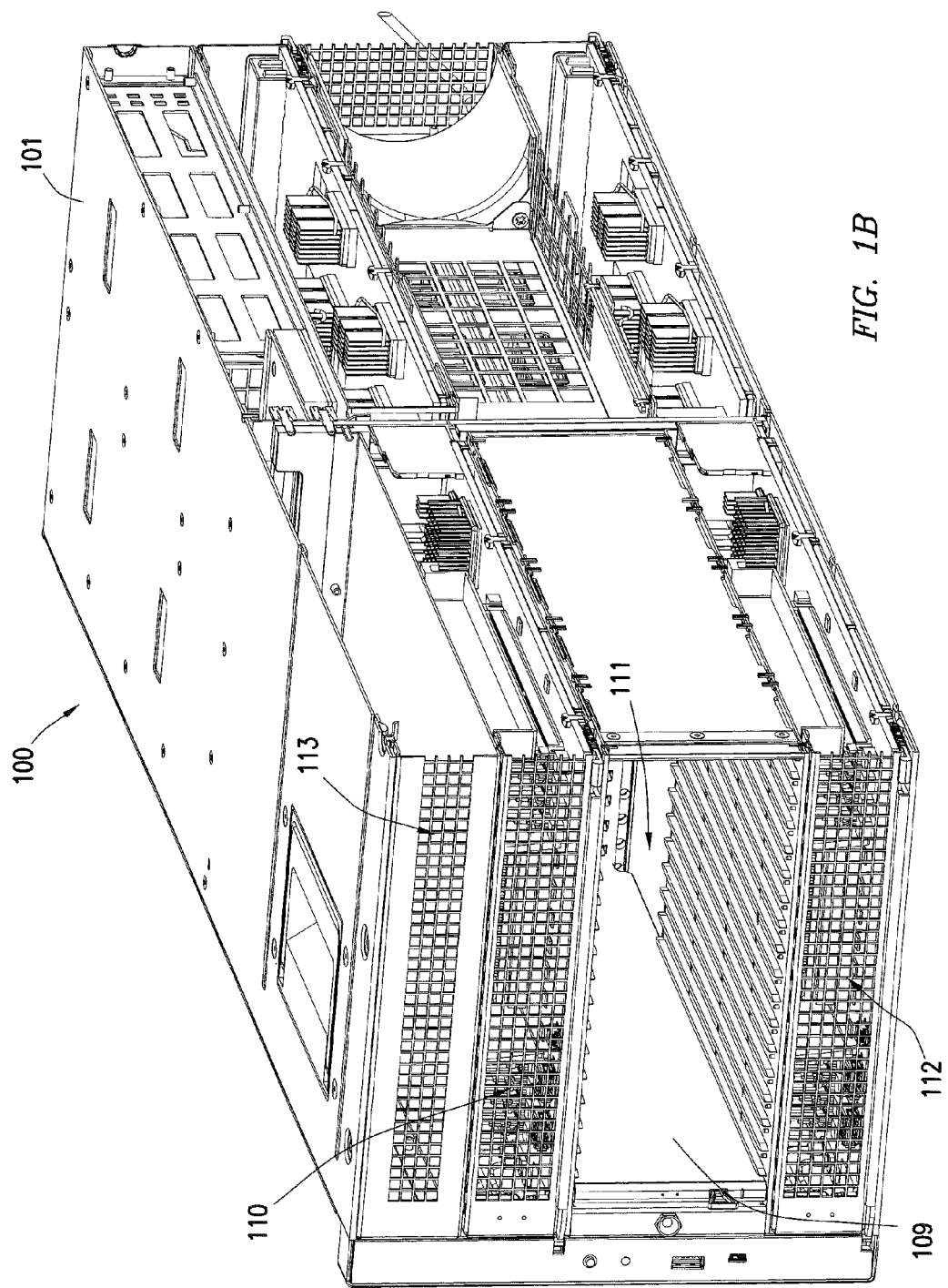
FIG. 1B shows a perspective view of a storage assembly in accordance with embodiments of the invention.

One or more aspects of the present disclosure is directed to a storage assembly system. Referring to FIGS. 1A and 1B, multiple perspective views of a storage assembly system 106 in accordance with embodiments disclosed herein are shown.

In one or more embodiments, the storage assembly system 106 may include a chassis 101, in which one or more components may be disposed and secured within. For example, as shown in FIG. 1B, one or more flash modules 109 are disposed within a front portion of the chassis 101. In one or more embodiments, the one or more flash modules 109 may be engaged within the chassis 101 of the storage assembly system 106.

Further, as shown, one or more openings may be formed through the chassis 101 of the storage assembly system 106, in which the one or more openings may allow airflow through the chassis 101 of the storage assembly system 106. In one or more embodiments, the aforementioned openings formed through the chassis 101 may include an upper airflow chamber 110, a central airflow chamber 111, and a lower airflow chamber 112. In one or more embodiments, structural arrangement of one or more internal components may allow airflow to be controllably directed from each of the upper airflow chamber 110 and the lower airflow chamber 112 into the central airflow chamber 111.

In one or more embodiments, the one or more flash modules 109 may be spaced apart when engaged within the chassis 101 of the storage assembly system 106 to allow airflow between one or more flash modules 109 into an interior of the chassis 101.

As shown in FIG. 1B, the storage assembly 100 includes the chassis 101 and the upper airflow chamber 110, the central airflow chamber 111, and the lower airflow chamber 112. As will be discussed further below, a fan module (not shown) may be used to pull air through each of the upper airflow chamber 110, the central airflow chamber 111, and the lower airflow chamber 112, and a structure of a printed circuit board (e.g., the first printed circuit board 203 shown in FIG. 2) and/or an air guide panel (e.g., the air guide panel 206 shown in FIG. 2) may direct airflow such that airflow through each of the upper airflow chamber 110, the central airflow chamber 111, and the lower airflow chamber 112 exits the chassis 101 through the central airflow chamber 111.

Figure 2:
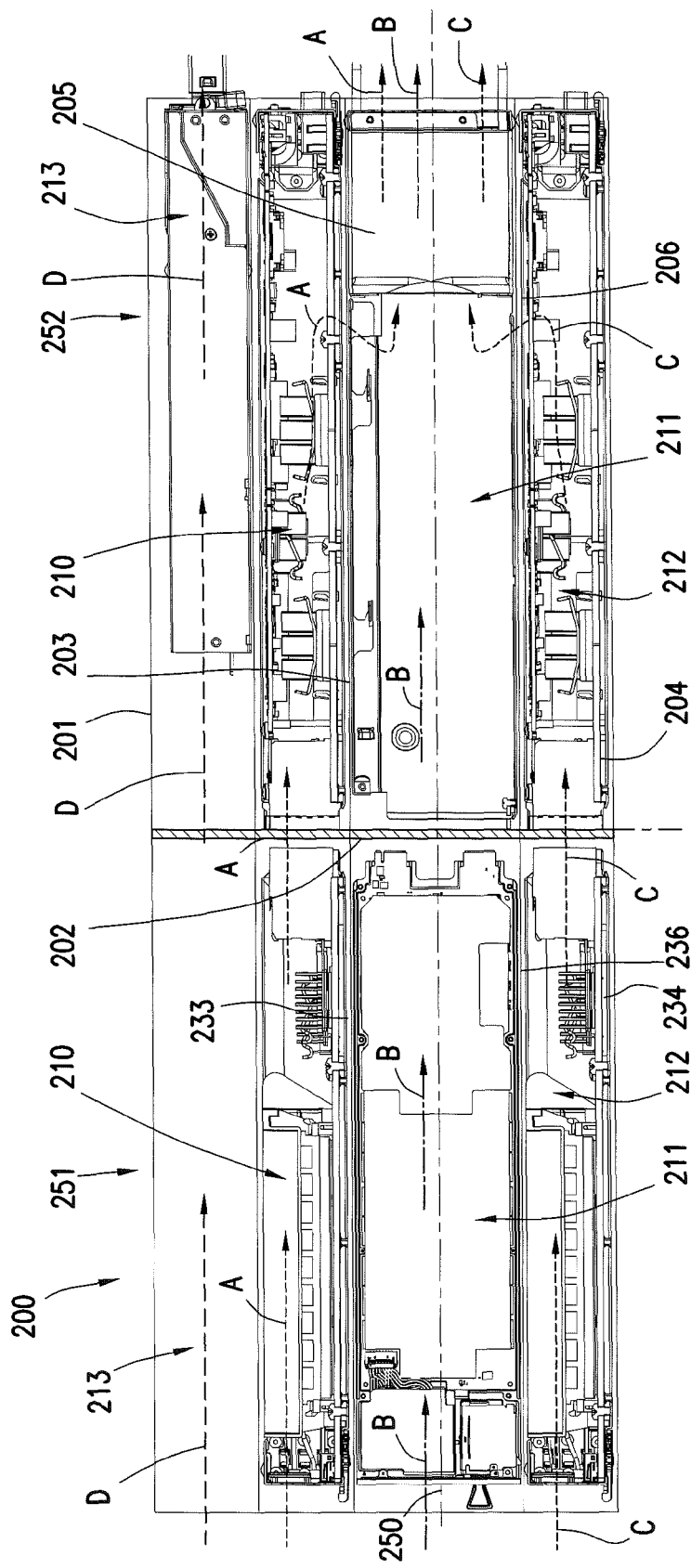
FIG. 2 shows a cross-sectional side view of a storage assembly in accordance with embodiments of the invention.

Referring to FIG. 2, a cross-sectional side view of a storage assembly system 200 in accordance with embodiments disclosed herein is shown. As shown, the storage assembly system 200 includes a chassis 201. In one or more embodiments, the chassis 201 may include a longitudinal axis 250 defined therethrough and an upper airflow chamber 210, a central airflow chamber 211, and a lower airflow chamber 212 formed longitudinally therethrough. Further, one or more embodiments may include a midplane 202 secured within the chassis 201 in a direction perpendicular to the longitudinal axis 250 defined through the chassis 201, in which the midplane 202 may define a front portion 251 and a rear portion 252 within the chassis 201. In one or more embodiments, the midplane 202 is configured to allow airflow therethrough (e.g., through each of the upper airflow chamber 210, the central airflow chamber 211, and the lower airflow chamber 212 from the front portion 251 of the chassis 201 to the rear portion 252 of the chassis 201).

Further, in one or more embodiments, the storage assembly system 200 may include a first printed circuit board 203 disposed within the rear portion 252 of the upper airflow chamber 210. In one or more embodiments, the first printed circuit board may include a first end, a second end, and an opening formed through the second end of the first printed circuit board 203. In one or more embodiments, the first end of the first printed circuit board 203 may be operatively coupled to the midplane 202, and the opening formed through the second end of the first printed circuit board 203 may be configured to allow airflow therethrough (e.g., along the directions shown by arrows A).

One or more embodiments of the storage assembly system 200 may also include a second printed circuit board 204 disposed within the rear portion 252 of the lower airflow chamber 212. In one or more embodiments, the second printed circuit board 204 may include a first end and a second end, in which the first end of the second printed circuit board 204 is operatively coupled to the midplane 202. In one or more embodiments, the second printed circuit board 204 may also include an opening formed through the second end of the second printed circuit board 204, which may be configured to allow airflow therethrough.

In one or more embodiments, the first printed circuit board 203 and the second printed circuit board 204 may both be oriented in the same direction. For example, in one or more embodiments, both the first printed circuit board 203 and the second printed circuit board 204 may be identical (or substantially identical) printed circuit boards having one or more components disposed on a top surface of each of the printed circuit boards. By orienting both the first printed circuit board 203 and the second printed circuit board 204 in the same direction (e.g., a first direction), the top surface of the first printed circuit board 203 and the top surface of the second printed circuit board 204 may both be oriented in an upward direction within the chassis 201 of the storage assembly system 200. As such, the one or more components disposed on a top surface of each of the printed circuit boards may also face in the same upward direction within the chassis 201 of the storage assembly system 200, such as shown in FIG. 2.

Furthermore, in one or more embodiments, the storage assembly system 200 may also include a third printed circuit board 233 and a fourth printed circuit board 234. In one or more embodiments, the third printed circuit board 233 may be operatively coupled at the midplane 202 to the first printed circuit board 203, and the fourth printed circuit board 234 may be operatively coupled at the midplane 202 to the second printed circuit board 204. In one or more embodiments, the third printed circuit board 233 and the fourth printed circuit board 234 may each be disposed in the front portion 251 of the chassis. Further, in one or more embodiments, the third printed circuit board 233 and/or the fourth printed circuit board 234 may be used to direct airflow through the front portion 251 of the chassis 201, as will be discussed further below.

In one or more embodiments, a fan module 205 may be within the rear portion 252 of the central airflow chamber 211 and may be operatively coupled to the midplane 202. In one or more embodiments, the fan module 205 may be configured to draw air from the front portion 251 of the chassis 201 to the rear portion 252 of the chassis 201 through each of the upper airflow chamber 210, the central airflow chamber 211, and the lower airflow chamber 212 (e.g., along the directions shown by arrows A, B, and C, respectively). In one or more embodiments, airflow may be isolated in each of the upper airflow chamber 210, the central airflow chamber 211, and the lower airflow chamber 212 until after the airflow moves beyond the midplane 202. In other words, airflow in each of the upper airflow chamber 210, the central airflow chamber 211, and the lower airflow chamber 212 may be isolated in front portion 251 of the chassis 201, but may not necessarily be isolated in the rear portion 252 of the chassis 201 (e.g., as shown by arrows A, B, and C).

In one or more embodiments, the third printed circuit board 233 and/or the fourth printed circuit board 234 may be used to direct airflow through the front portion 251 of the chassis 201. For example, in one or more embodiments, the third printed circuit board 233 and/or the fourth printed circuit board 234 may each prevent airflow therethrough. For example, unlike the first printed circuit board 203 and/or the second printed circuit board 204, one or more embodiments of the third printed circuit board 233 and the fourth printed circuit board 234 may not necessarily include an opening formed therethrough. As such, in one or more embodiments, airflow through the front portion 251 of the upper airflow chamber 210 (e.g., along the direction shown by arrow A in the front portion 251 of the chassis 201) may be isolated from the airflow through the front portion 251 of the central airflow chamber 211 (e.g., along the direction shown by arrow B in the front portion 251 of the chassis 201) by the third printed circuit board 233 until the airflow passes through the midplane 202 and into the rear portion 252 of the chassis 201.

One or more embodiments of the storage assembly system 200 may also include a first air guide panel 206 disposed within the rear portion 252 of the lower airflow chamber 212 between the second printed circuit board 204 and the central airflow chamber 211. In one or more embodiments, the first air guide panel 206 may include a first end, a second end, and an opening formed through the second end of the first air guide panel 206, which may be configured to allow airflow therethrough (e.g., along the directions shown by arrows C). In one or more embodiments, the openings formed in each of the first printed circuit board 203, the second printed circuit board 204, and/or the first air guide 206 may be formed closer to the second end than the first end of each of the first printed circuit board 203, the second printed circuit board 204, and the first air guide panel 206. In other words, in one or more embodiments, the openings formed in each of the first printed circuit board 203, the second printed circuit board 204, and/or the first air guide panel 206 may be formed closer to the fan module 205 than the midplane 202.

Further, in one or more embodiments, a second air guide panel 236 may be disposed within the front portion 251 of the lower airflow chamber 212 between the fourth printed circuit board 234 and the central airflow chamber 211. Unlike the first air guide panel 206, one or more embodiments of the second air guide panel 236 may not necessarily include an opening therethrough. As such, in one or more embodiments, airflow through the front portion 251 of the lower airflow chamber 212 (e.g., along the direction shown by arrow C in the front portion 251 of the chassis 201) may be isolated from the airflow through the front portion 251 of the central airflow chamber 211 (e.g., along the direction shown by arrow B in the front portion 251 of the chassis 201) by the second air guide panel 236 until the airflow passes through the midplane 202 and into the rear portion 252 of the chassis 201.

In one or more embodiments, the function of each of the first air guide panel 206 and the second air guide panel 236 is to enable a similar airflow pattern over each of the printed circuit boards mounted in the storage assembly system 200 regardless if the airflow is drawn down through openings formed in a printed circuit board when installed in the upper chamber 210 (e.g., the first printed circuit board 203), or if the airflow is drawn upward when a printed circuit board is installed in the lower chamber 212 (e.g., the second printed circuit board 204). As such, whether a printed circuit board having an opening formed therethrough (e.g., the first printed circuit board 203 having an opening formed through the second end thereof) is installed in the upper airflow chamber 210 or the lower airflow chamber 212, the first air guide panel 206 having an opening formed therethrough may enable a desired airflow pattern over the printed circuit board. As such, a printed circuit board may perform similarly whether installed in the upper airflow chamber 210 or the lower airflow chamber 212, and airflow through each of the upper airflow chamber 210 and the lower airflow chamber 212 may be one of identical and substantially identical.

As shown, in one or more embodiments, airflow through each of the upper airflow chamber 210, the central airflow chamber 211, and the lower airflow chamber 212 are isolated from each other through the front portion 251 of the chassis 201, and airflow through each of the upper airflow chamber 211, the central airflow chamber 211, and the lower airflow chamber 212 are combined with each other in the central airflow chamber 211 in the rear portion 252 of the chassis 201.

In one or more embodiments, the front portion 251 of the central airflow chamber 211 of the chassis 201 may be configured to receive a plurality of flash modules (not shown). In one or more embodiments, one or more flash modules may be oriented within the chassis 201 of the storage assembly system 200 in an orientation that is orthogonal to the orientation of each of the printed circuit boards when the one or more flash modules are engaged within the chassis 201. In one or more embodiments, the midplane 202 may be configured to operatively couple with each of the plurality of flash modules. Further, in one or more embodiments, airflow is allowed between the plurality of flash modules when the plurality of flash modules are operatively coupled to the midplane 202. As such, when air is pulled through the chassis 201 of the storage assembly system 200 (e.g., by a fan module), air may be pulled from a front portion 251 of the chassis 201, between the plurality of flash modules operatively coupled to the midplane 202, and into a rear portion of 252 of the chassis 201.

Further, in one or more embodiments, the rear portion 252 of the central airflow chamber 211 of the chassis 201 may be configured to receive a plurality of fan modules. In one or more embodiments, the air guide panel 206 may be a portion of a fan module, such that openings formed through the air guide panel 206 are, instead, openings formed through a portion of the fan module. In one or more embodiments, each of the plurality of fan modules may be configured to operatively couple to the midplane 202.

Moreover, in one or more embodiments, a power supply airflow chamber 213 may be formed longitudinally through the chassis 201. In one or more embodiments, the power supply airflow chamber 213 may be isolated from each of the upper airflow chamber 210, the central airflow chamber 211, and the lower airflow chamber 212. In one or more embodiments, the power supply airflow chamber 213 may direct airflow along the directions of arrows D. In one or more embodiments, the power supply airflow chamber 213 may be isolated from each of the upper airflow chamber 210, the central airflow chamber 211, and the lower airflow chamber 212 by a panel structure disposed between the power supply airflow chamber 213 and one of the upper airflow chamber 210, the central airflow chamber 211, and the lower airflow chamber 212. As shown in FIG. 2, the power supply airflow chamber 213 may be formed above the upper airflow chamber 210. Further, as shown, a panel structure is disposed between the power supply airflow chamber 213 and the upper airflow chamber 210 such that airflow through the power supply airflow chamber 213 is isolated from airflow through the upper airflow chamber 210. Alternatively, in one or more embodiments, the power supply airflow chamber 213 may be formed below the lower airflow chamber 212.

In one or more embodiments, redirecting airflow through the upper airflow chamber 210 into the central airflow chamber 211 may include pulling air from the upper airflow chamber 210, through the opening formed through the first printed circuit board 203, and into the central airflow chamber 211 such that airflow through the upper airflow chamber 210 exits through the central airflow chamber 211 of the chassis 201 of the storage assembly 200.

Further, in one or more embodiments, redirecting airflow through the lower airflow chamber 212 into the central airflow chamber 211 may include pulling air from the lower airflow chamber 212, through the opening formed through the air guide panel 206, and into the central airflow chamber 211 such that airflow through the lower airflow chamber 212 exits through the central airflow chamber 211 of the chassis 201 of the storage assembly 200.

Figure 3:
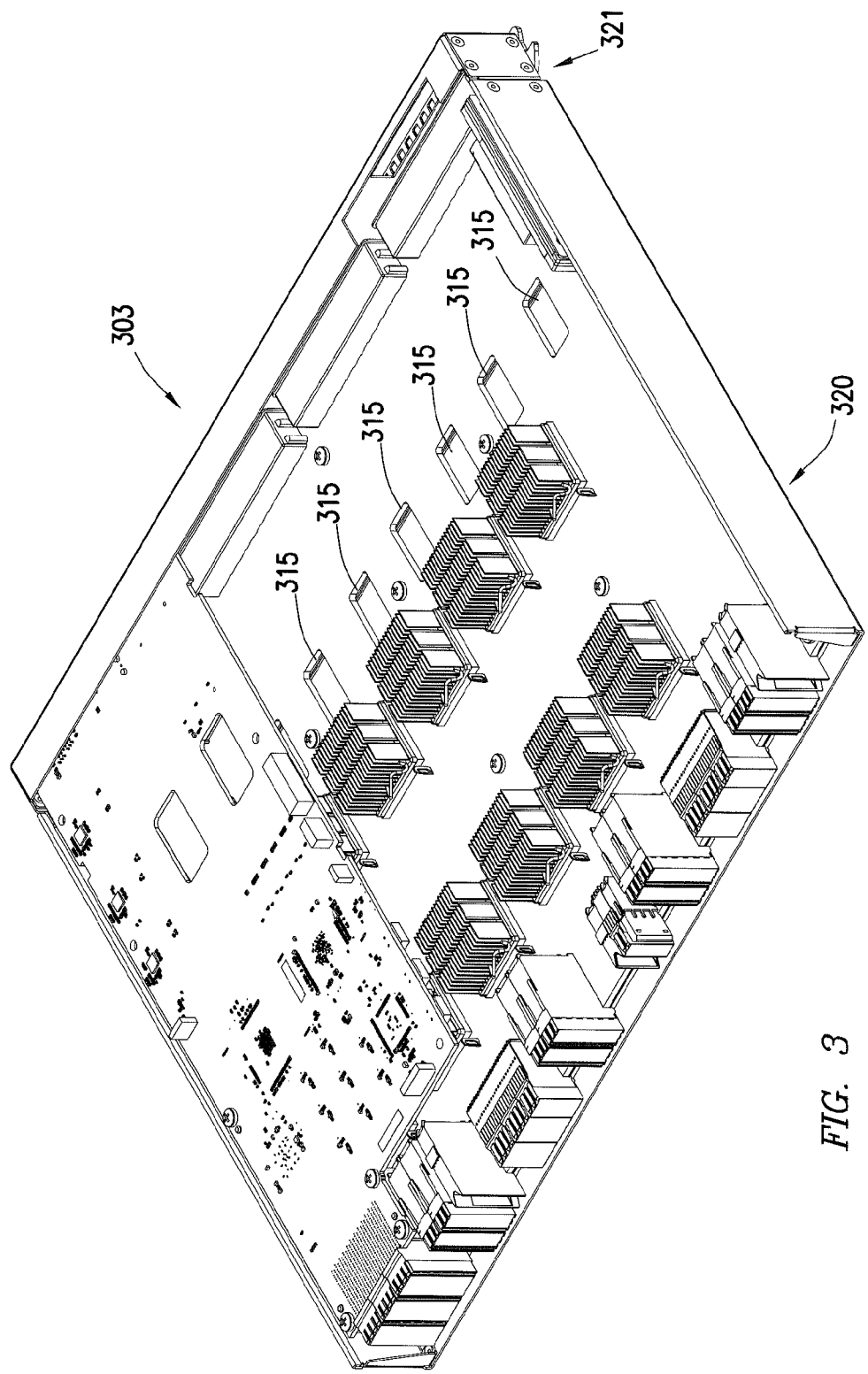
FIG. 3 shows a perspective view of a printed circuit board in accordance with embodiments disclosed herein.

Referring now to FIG. 3, a perspective view of a printed circuit board 303 in accordance with embodiments disclosed herein is shown. As shown, the printed circuit board 303 includes a first end 320 and a second end 321. In one or more embodiments, the first end 320 of the printed circuit board 303 may be operatively coupled to a midplane (e.g., the midplane 102). Further, as shown, in one or more embodiments, the printed circuit board 303 may include one or more openings 315 formed through the second end 321 of the printed circuit board 303. In one or more embodiments, forming the one or more openings 315 on the second end 321 of the printed circuit board 303 may allow airflow along a majority of the length of the printed circuit board 303. In one or more embodiments, the longitudinal location of the one or more openings 315 may be determined by a desired airflow path, which may impact thermal conditions of a storage assembly (e.g., the storage assembly 100). As such, in one or more embodiments, the one or more openings 315 of the printed circuit board 303 may be formed on the first end 320, the second end 321, and/or any portion of the printed circuit board 303 therebetween.

Figure 4:
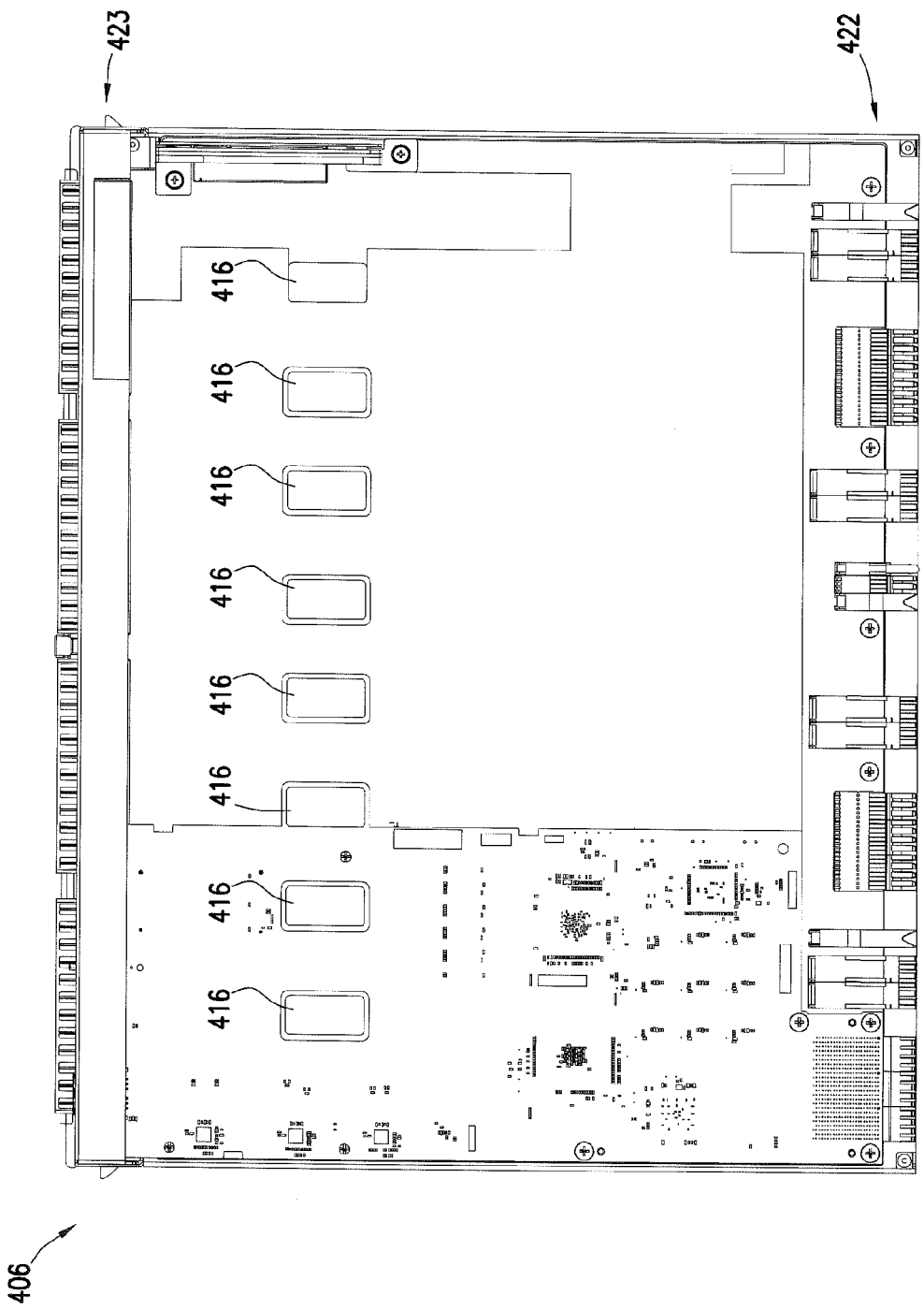
FIG. 4 shows a top view of an air guide panel in accordance with embodiments disclosed herein.

Referring now to FIG. 4, a top view of an air guide panel 406 in accordance with embodiments disclosed herein is shown. As shown, the air guide panel 406 includes a first end 422 and a second end 423. In one or more embodiments, the first end 422 of the air guide panel 406 may be operatively coupled to a midplane (e.g., the midplane 102). However, the air guide panel 406 is not necessarily limited to being operatively coupled to a midplane. Further, as shown, in one or more embodiments, the air guide panel 406 may include one or more openings 416 formed through the second end 423 of the air guide panel 406. In one or more embodiments, forming the one or more openings 416 on the second end 423 of the air guide panel 406 may allow airflow along a majority of the length of the air guide panel 406. In one or more embodiments, the longitudinal location of the one or more openings 416 may be determined by a desired airflow path, which may impact thermal conditions of a storage assembly (e.g., the storage assembly 100). As such, in one or more embodiments, the one or more openings 416 of the air guide panel 406 may be formed on the first end 422, the second end 423, and/or any portion of the air guide panel 406 therebetween.

In one or more embodiments, the number, dimensions, and location of openings 416 formed in the air guide panel 406 may correspond directly with the number, dimensions, and location of openings formed through a printed circuit board (e.g., the printed circuit board 303). For example, in one or more embodiments, the number, dimensions, and location of openings 416 formed in the air guide panel 406 may correspond directly with the number, dimensions, and location of openings formed through an adjacent printed circuit board disposed within a storage assembly (e.g., the storage assembly 100).

One or more aspects of the present disclosure is directed to a method of managing airflow through a storage assembly system. In one or more embodiments, the method of managing airflow through a storage assembly system may include pulling air through a chassis of a storage assembly, the chassis of the storage assembly having a longitudinal axis defined therethrough and an upper airflow chamber, a central airflow chamber, and a lower airflow chamber formed longitudinally therethrough, redirecting airflow through the upper airflow chamber into the central airflow chamber, and redirecting airflow through the lower airflow chamber into the central airflow chamber.

While the disclosure includes a limited number of embodiments, those skilled in the art, having benefit of this disclosure, will appreciate that other embodiments may be devised which do not depart from the scope of the disclosure. Although only a few example embodiments have been described in detail above, those skilled in the art will readily appreciate that many modifications are possible in the example embodiments without materially departing from this invention. Accordingly, all such modifications are intended to be included within the scope of this disclosure.

What is claimed is:

1. A system, comprising:
   a chassis having a longitudinal axis defined therethrough and an upper airflow chamber, a central airflow chamber, and a lower airflow chamber formed longitudinally therethrough;
   a midplane secured within the chassis in a direction perpendicular to the longitudinal axis defined through the chassis, wherein the midplane defines a front portion and a rear portion within the chassis, and wherein the midplane is configured to allow airflow therethrough;
   a first printed circuit board disposed within the rear portion of the chassis in the upper airflow chamber, the first printed circuit board having a first end, a second end, and an opening formed therethrough, wherein the first end of the first printed circuit board is operatively coupled to the midplane;
   a second printed circuit board disposed within the rear portion of the chassis in the lower airflow chamber, the second printed circuit board having a first end and a second end, wherein the first end of the second printed circuit board is operatively coupled to the midplane;
   a fan module disposed within the rear portion of the chassis in the central airflow chamber and operatively coupled to the midplane, wherein the fan module is configured to draw air from the front portion of the chassis to the rear portion of the chassis through each of the upper airflow chamber, the central airflow chamber, and the lower airflow chamber,
   wherein the opening formed through the first printed circuit board is configured to allow airflow therethrough.

2. The system of claim 1, further comprising an air guide panel disposed within the rear portion of the chassis in the lower airflow chamber between the second printed circuit board and the central airflow chamber, the air guide panel having a first end, a second end, and an opening formed through the second end of the air guide panel configured to allow airflow therethrough.

3. The system of claim 2, wherein the opening formed through the second end of the air guide panel is positioned closer to an end of the rear portion of the chassis than to the midplane.

4. The system of claim 1, wherein the second printed circuit board comprises an opening formed therethrough, and the opening formed through the second printed circuit board is configured to allow airflow therethrough.

5. The system of claim 4, wherein the opening formed through the second printed circuit board is positioned closer to an end of the rear portion of the chassis than to the midplane.

6. The system of claim 1, wherein the opening formed through the first printed circuit board is positioned closer to an end of the rear portion of the chassis than to the midplane.

7. The system of claim 1, wherein airflow through both the upper airflow chamber and through the lower airflow chamber are configured to mix in at least a portion of the central airflow chamber.

8. The system of claim 1, wherein the first printed circuit board is substantially identical to the second printed circuit board.

9. The system of claim 1, wherein the first printed circuit board and the second printed circuit board are both oriented in a first direction.

10. The system of claim 9, wherein both the first printed circuit board and the second printed circuit board have components mounted on a top surface thereof when the first printed circuit board and the second printed circuit board are operatively coupled to the midplane.

11. The system of claim 1, wherein the chassis further comprises a power supply airflow chamber formed longitudinally therethrough.

12. The system of claim 11, wherein airflow through the power supply airflow chamber is isolated from each of the upper airflow chamber, the central airflow chamber, and the lower airflow chamber.

13. The system of claim 1, wherein the central airflow chamber in the front portion of the chassis is configured to receive a plurality of flash modules.

14. The system of claim 1, wherein the central airflow chamber in the rear portion of the chassis is configured to receive a plurality of fan modules.

15. The system of claim 14, wherein the midplane is configured to operatively couple to the plurality of fan modules.

16. The system of claim 15, wherein each of the plurality of fan modules is configured to allow airflow therethrough.

17. The system of claim 13, wherein the midplane is configured to operatively couple to the plurality of flash modules.

18. The system of claim 17, wherein airflow is allowed between the plurality of flash modules when the plurality of flash modules are operatively coupled to the midplane.

19. A system, comprising:
   a chassis having a longitudinal axis defined therethrough and an upper airflow chamber, a central airflow chamber, and a lower airflow chamber formed longitudinally therethrough;
   a midplane secured within the chassis in a direction perpendicular to the longitudinal axis defined through the chassis, wherein the midplane defines a front portion and a rear portion within the chassis, and wherein the midplane is configured to allow airflow therethrough;
   a first printed circuit board disposed within the rear portion of the chassis in the upper airflow chamber, the first printed circuit board having a first end, a second end, and an opening formed therethrough, wherein the first end of the first printed circuit board is operatively coupled to the midplane;
a second printed circuit board disposed within the rear portion of the chassis in the lower airflow chamber, the second printed circuit board having a first end and a second end, wherein the first end of the second printed circuit board is operatively coupled to the midplane;
a third printed circuit board disposed within the front portion of the chassis in the upper airflow chamber, the third printed circuit board having a first end, a second end, and an opening formed therethrough, wherein the second end of the third printed circuit board is operatively coupled to the midplane;
a fourth printed circuit board disposed within the front portion of the chassis in the lower airflow chamber, the fourth printed circuit board having a first end and a second end, wherein the second end of the fourth printed circuit board is operatively coupled to the midplane;
a first air guide panel disposed within the rear portion of the chassis in the lower airflow chamber between the second printed circuit board and the central airflow chamber, the first air guide panel having a first end, a second end, and an opening formed through the second end of the air guide panel;
a second air guide panel disposed within the front portion of the chassis in the lower chamber between the fourth printed circuit board and the central airflow chamber, the second air guide panel having a first end and a second end; and a fan module disposed within the rear portion of the chassis in the central airflow chamber and operatively coupled to the midplane, wherein the fan module is configured to draw air from the front portion of the chassis to the rear portion of the chassis through each of the upper airflow chamber, the central airflow chamber, and the lower airflow chamber,
wherein the opening formed through the first printed circuit board and the opening formed through the first air guide panel are configured to allow airflow therethrough.

20. A chassis, comprising:
an upper airflow chamber;
a central airflow chamber disposed below the upper airflow chamber and having flash modules disposed therein;
a lower airflow chamber disposed below both the upper airflow chamber and the central airflow chamber; and
a midplane defining a front portion and a rear portion within the chassis, wherein the midplane is configured to allow airflow therethrough,
wherein airflow through each of the upper airflow chamber, the central airflow chamber, and the lower airflow chamber are isolated from each other through the front portion of the chassis, and
wherein airflow through each of the upper airflow chamber, the central airflow chamber, and the lower airflow chamber are combined with each other in the central airflow chamber in the rear portion of the chassis.

* * * * *